(12) United States Patent
Pozder et al.

(10) Patent No.: US 7,041,576 B2
(45) Date of Patent: May 9, 2006

(54) SEPARATELY STRAINED N-CHANNEL AND P-CHANNEL TRANSISTORS

(75) Inventors: Scott K. Pozder, Austin, TX (US); Salih M. Celik, Austin, TX (US); Byoung W. Min, Austin, TX (US); Vance H. Adams, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/856,581

(22) Filed: May 28, 2004

(65) Prior Publication Data

US 2005/0275017 A1   Dec. 15, 2005

(51) Int. Cl.
 *H01L 21/30* (2006.01)
(52) U.S. Cl. .................................... 438/458; 438/109
(58) Field of Classification Search ............ 438/459, 438/458; 257/347
See application file for complete search history.

(56) References Cited

U.S. PATENT DOCUMENTS

| 5,534,713 | A |   | 7/1996  | Ismail |
| 5,872,393 | A | * | 2/1999  | Sakai et al. .................. 257/664 |
| 6,059,895 | A |   | 5/2000  | Chu |
| 6,358,828 | B1 |  | 3/2002  | Kadosh |
| 6,500,694 | B1 | * | 12/2002 | Enquist ....................... 438/109 |
| 2003/0231967 | A1 | * | 12/2003 | Najafi et al. ................. 417/322 |

OTHER PUBLICATIONS

Kwon et al., "A Wafer-Scale 3D IC Technology Platform Using Dielectric Bonding Glues and Copper Damascene Patterned Inter-Wafer Interconnects," IEEE, pp. 78-80.

* cited by examiner

*Primary Examiner*—Edward Wojciechowicz
(74) *Attorney, Agent, or Firm*—David G. Dolezal; James L. Clingan, Jr.

(57) ABSTRACT

An integrated circuit with a first plurality of transistors formed on a first wafer and second plurality of transistors formed on a second wafer. At least a substantial majority of the transistor of the first transistor are of a first conductivity type and at least a substantial majority of the transistors of the second plurality are of a second conductivity type. After wafers are bonded together, a portion of the second wafer is removed wherein the strain of the channels of the second plurality of transistors is more compressive than the strain of the channels of the first plurality of transistors.

21 Claims, 5 Drawing Sheets

SEPARATELY STRAINED N-CHANNEL AND P-CHANNEL TRANSISTORS

BACKGROUND OF THE INVENTION

1. Field of the Invention

This invention relates in general to integrated circuits and in particular to integrated circuits with differently strained channels for transistors of different conductivity types.

2. Description of the Related Art

The strain of a channel of a transistor affects the carrier mobility of the transistor. Strain may be induced either intentionally or unintentionally during the manufacture. A particular strain differently affects the electron mobility of N-channel transistors and the hole mobility of P-channel transistors. A particular strain may be more desirable for the operating speed of an N-channel transistor and less desirable for the operating speed of a P-channel transistor. For example, a more tensile strain of a channel region may provide for an increase in electron mobility and a decrease in hole mobility.

What is desired is an integrated circuit with improved operating speeds for both N-channel transistors and P-channel transistors.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of a mode for carrying out the invention. The description is intended to be illustrative of the invention and should not be taken to be limiting.

Figure 1:
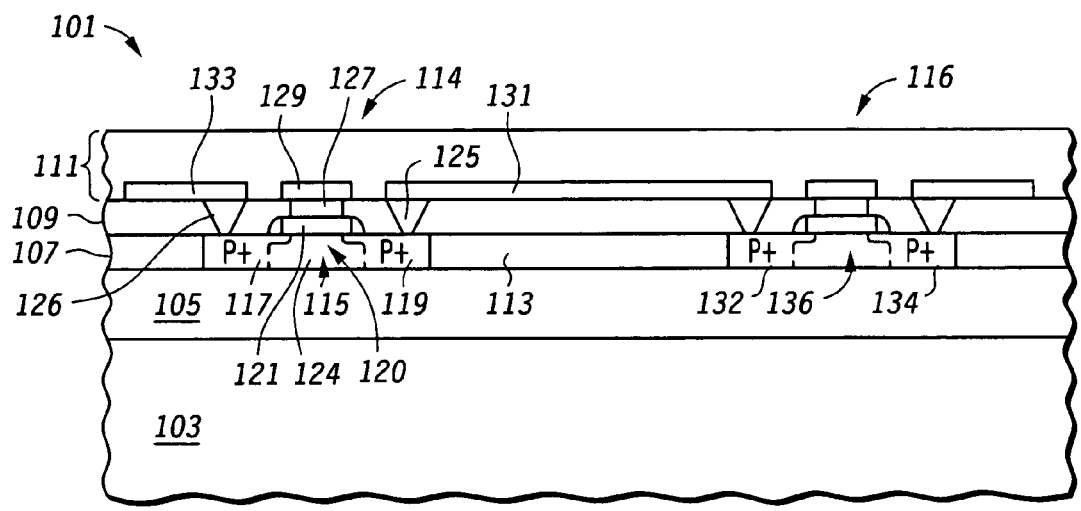
FIG. 1 is a partial cutaway side view of a wafer during a stage in manufacture of one embodiment of an integrated circuit according to the present invention.
Figure 2:
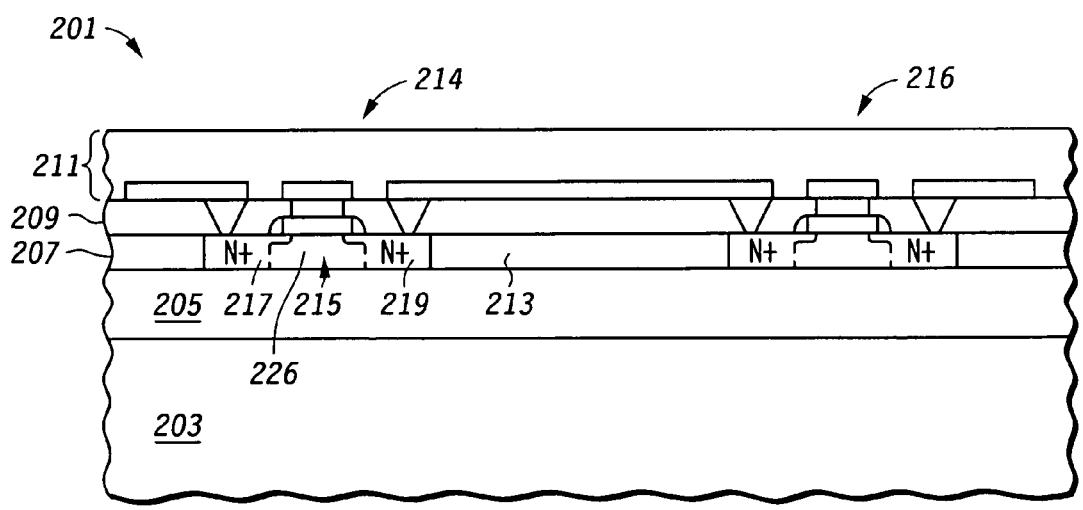
FIG. 2 is a partial cutaway side view of a wafer during another stage in manufacture of one embodiment of an integrated circuit according to the present invention.
Figure 3:
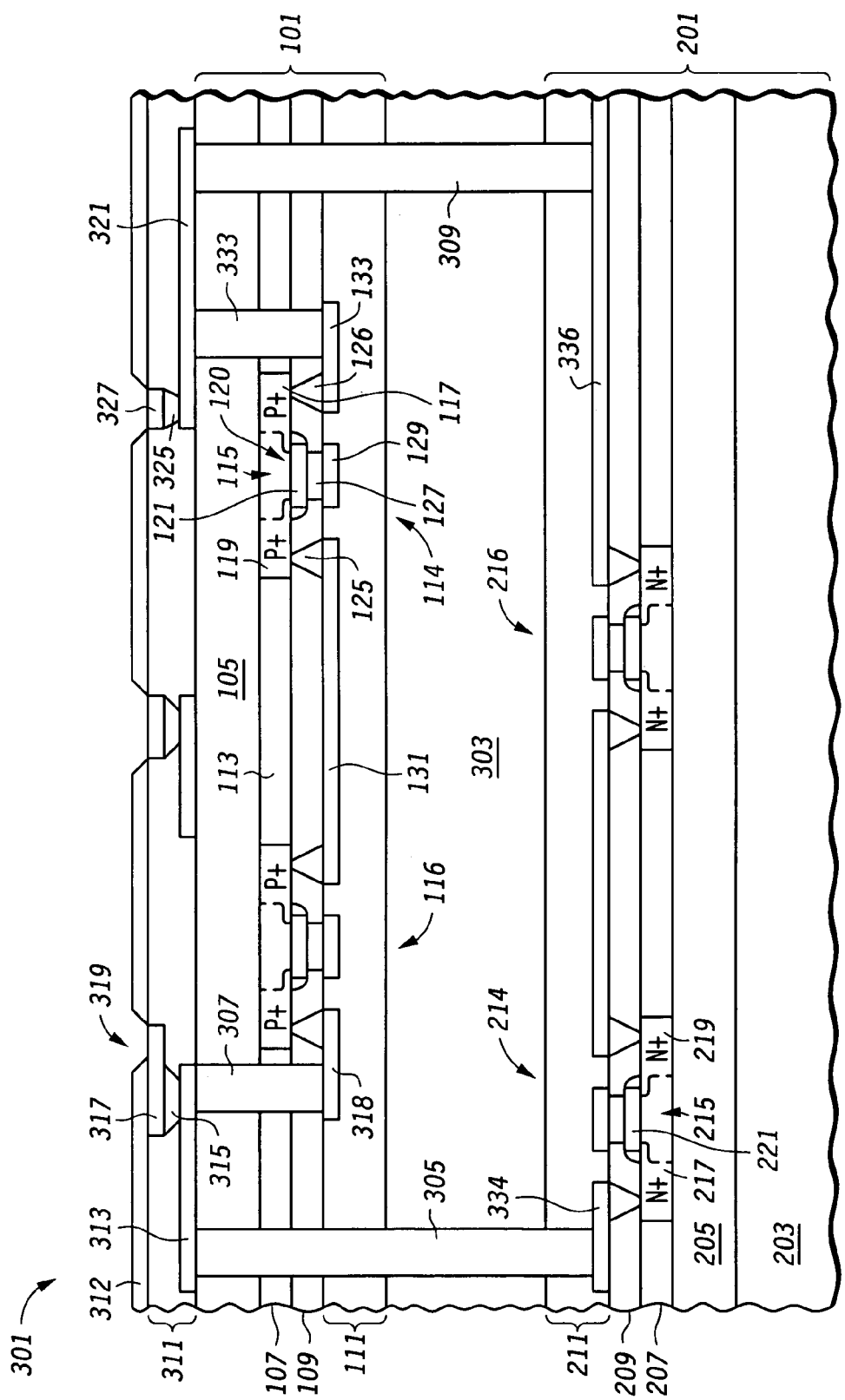
FIG. 3 is a partial cutaway side view of a wafer during another stage in manufacture of one embodiment of an integrated circuit according to the present invention.

FIGS. 1–3 show three different stages during the manufacture of one embodiment of an integrated circuit according to the present invention. FIG. 1 shows a partial side cutaway view of a wafer according to the present invention. Shown on wafer 101 are two P-channel transistors 114 and 116 located over insulator 105 and substrate 103. Transistor 114 includes an active region 115 formed in layer 107. Active region 115 is made of a semiconductor material (e.g. silicon) that is doped with an N conductivity type dopant (e.g. phosphorous or arsenic). Active region includes a body 124 and two source/drain regions 117 and 119 that are counter doped to have a P+ type conductivity. Transistor 114 includes a gate 121 (e.g. polysilicon or metal) located over the channel region 120 of transistor 114, which is located in active region 115.

Oxide portion 113 of layer 107 is located between active region 115 of transistor 114 and the active region 136 of transistor 116. Oxide portion 113 serves as an isolation region between active regions. In one embodiment, oxide portion 113 is formed by etching silicon or other semiconductor material of layer 107 and then filling with an oxide. In one embodiment, the active regions of layer 107 are made of a single material (e.g. silicon). In other embodiments, layer 107 may be made of multiple layers of different materials, e.g. a silicon layer on a silicon germanium layer.

Via 127 electrically couples gate 121 to an interconnect 129 in inter level dielectric (ILD) 111. Interconnect 129 is coupled to either another gate (not shown) or another source/drain region (not shown). Source/drain contact 125 (e.g. made of tungsten) couples source/drain region 119 to interconnect 131 of ILD 111. Source/drain contact 126 couples source/drain region 117 to interconnect 133 of ILD 111. Interconnect 131 couples source/drain region 119 to source/drain region 132 of P-channel transistor 116. In the embodiment shown, ILD 111 includes only a single layer of interconnects, but in other embodiments, may have multiple layers of interconnects.

Barrier layers (e.g. of titanium, titanium nitride) may be located between the contacts (125 and 126) and the source/drain regions (119 and 117), between the interconnects and the vias, and/or on the side walls of the vias, interconnects, and contacts. Also, the top portions of the gates and the source/drain regions may include silicides (not shown).

In one embodiment, substrate 103 has a thickness of 600 microns, insulator 105 has a thickness of 200 nm, layer 107 has a thickness of 110 nm, polysilicon/contact layer 109 has a thickness of 400 nm, and ILD 111 has a thickness of 200 nm. Other wafers may have other dimensions in other embodiments. In one embodiment, substrate 103 is at least 100 times thicker than layer 107, and in some embodiments is at least 1000 times thicker.

FIG. 2 shows a partial side cutaway view of another wafer according to the present invention. Shown on wafer 201 are two N-channel transistors 214 and 216 located over insulator 205 and substrate 203. Wafer 201 is similar to wafer 101 except that transistor 214 and 216 are N-type transistors. Transistor 214 includes an active region 215 formed in active layer 207. Active region 215 is doped with a P conductivity type dopant (e.g. boron) and includes a body 226 and two source/drain regions 217 and 219 that are counter doped to have an N+ type conductivity. An ILD 211 is located over a gate/contact layer 209.

In subsequent processing, wafer 101 is inverted and bonded to wafer 201 in a "face-to-face" configuration to form a resultant wafer. In such a configuration, the transistors 114 and 116 are bonded in a face down configuration.

Substrate 103 is then removed e.g. by grinding substrate 103 to about 50 microns of thickness and then by performing a follow up etch of Tetramethylammonioum Hydroxide (TMAH) to remove the remaining portion of substrate 103. Other types of enchants may be used for removing the remaining portion of the substrate in other embodiments. In other embodiments, insulator 105 may be removed as well.

FIG. 3 is as partial side cutaway view of the resultant wafer 301 after wafer 101 has been bonded to wafer 201, substrate 103 has been removed, and a subsequent ILD 311 has been formed. In some embodiments, after substrate 103 has been removed, a subsequent dielectric layer (not shown) e.g. of 200 nm may be deposited on insulator 105 to protect insulator 105 prior to forming ILD 311. In other embodiments, such a subsequent layer of dielectric is not utilized.

The wafers are bonded with a bonding material 303 applied to ILD 211. In one embodiment, the bonding material 303 is benzocyclobutene (BCB). In one embodiment, the material is sold by the DOW CHEMICAL COMPANY under the trade name of CYCLOTENE In one embodiment, bonding material 303 has a low Young's Modulus (e.g. 10 giga pascals or less). In one embodiment, bonding material 303 has a Young's Modulus of 2.9 giga pascals.

Prior to bonding, layers 107 and 207 have a form that is governed by the form of their respective substrates (e.g. 103 and 203) and a resulting strain governed by their respective substrates and ILDs and governed the processes by which they were made. In some embodiments, the wafers have a slight upward bow (e.g. radius of curvature of 80–100 meters or more). When substrate 103 is removed, the stress on layer 107 provided by substrate 103 is removed, thereby making the strain on the active regions of layer 107 more compressive. Removal of substrate 103 causes the ILD 111 to provide a compressive stress on the active regions of layer 107, which causes the strain of the active regions of layer 107 to become more compressive. This compressive strain increases hole mobility for the channel regions (e.g. 120) of transistors built in those active regions. Before removal of substrate 103, substrate 103 (e.g. with a Young's modulus of 47 giga pascals for bulk silicon) provided a counter force to the compressive stress of ILD 111. After the removal of substrate 103, bonding material 303 (e.g. with a Young's modulus of 2.9 giga pascals in one embodiment) provides a reduced counterforce to this compressive stress.

Providing an increased stress on the active regions of layer 107 provides for channel regions formed in those active regions to have a greater compressive strain, thereby having channel regions with greater hole mobility. Accordingly, P-channel devices whose channel regions are located in the active regions of layer 107 have a greater hole mobility than the transistors (e.g. 214 and 216) having channel regions in layer 207.

In the embodiment shown, bonding material 303 has a low Young's modulus which allows for the structure of wafer 201 to have a minimal effect on the strain of the active regions of layer 107. Thus, the active regions of layer 107 to have a more compressive strain than the active regions of layers 207.

Prior to forming ILD 311, holes for vias 305 and 309 are formed through to interconnects 334 and 336 respectively of ILD 111. Holes are also formed through to interconnects 318 and 133, respectively, of ILD 111. After a layer of via metal is deposited to fill the holes, the resultant wafer 301 is polished (e.g. chemical mechanical polishing) for planarization and removal of excess metal exterior to the holes. Afterwards interconnect layer (ILD) 311 is formed. ILD 311 includes interconnects 313 and 321 that couple the interconnects of ILD 111 with interconnects of ILD 211. Also, ILD 311 includes pads (317 and 327) for external coupling of the transistors of the resultant wafer. A passivation layer 312 having openings (e.g. 319) for expositing the pads (e.g. 317) is located on ILD 311. In some embodiments, vias may be formed to contact the backside of the source/drain regions (e.g. 119) of layer 107.

Subsequent processing steps may be performed on wafer 301 such as e.g. forming conductive caps and singulation after individual integrated circuits.

Having an integrated circuit with channel regions of a layer having a compressive strain that is greater than channel regions of another layer may allow for an integrated circuit to have P-channels transistors with channel regions having a relatively more compressive strain to improve hole mobility and N-channel transistors having channel regions with a relatively more tensile strain for improved electron mobility. Accordingly, an integrated circuit may be made from wafer 301 where most, if not all, of the P-channel transistors are located in the remaining layers of wafer 101 and most, if not all, of the N-channel transistors are located in the layers of wafer 201. With such a configuration, in some embodiments, the P-channel transistors can be manufactured for increase hole mobility and the N-channel transistors can be manufactured for increased electron mobility.

In one embodiment, the strain of the channel regions of layer 107 is more compressive than the strain of the channel regions of layer 207. As shown on FIG. 3, the compressive strain is in a lateral direction, relative to the view of FIG. 3, but it may also be more compressive in the direction of into the page, relative to the view shown in FIG. 3.

FIG. 3 shows an example of how one wafer is bonded in a face down configuration to another wafer in order to achieve a resultant wafer with channel regions in a first layer having a strain that is more compressive than the strain of the channel regions of a second layer. Also, bonding a wafer in a face up configuration to another wafer may also achieve, in some embodiments, a resultant wafer with channel regions in a first layer having a strain that is more compressive than the strain of the channel regions of a second layer. In some embodiments, the strain is slightly more compressive for a face up configuration than for a face down configuration.

Figure 4:
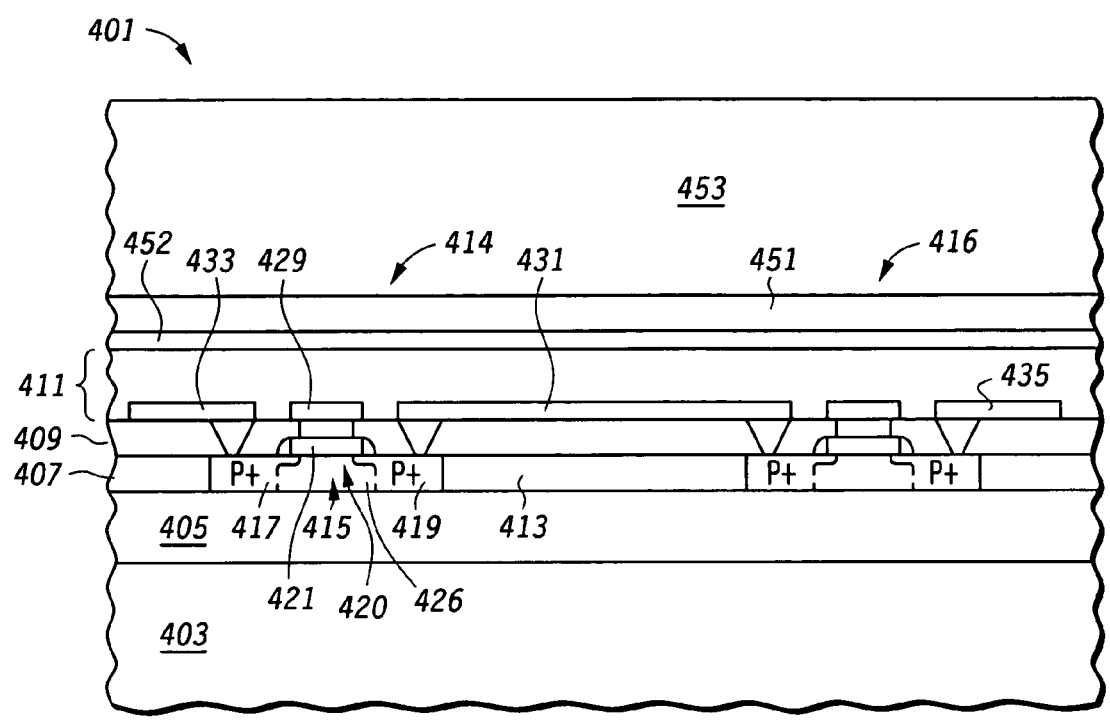
FIG. 4 is a partial cutaway side view of a wafer during a stage in manufacture of another embodiment of an integrated circuit according to the present invention.
Figure 5:
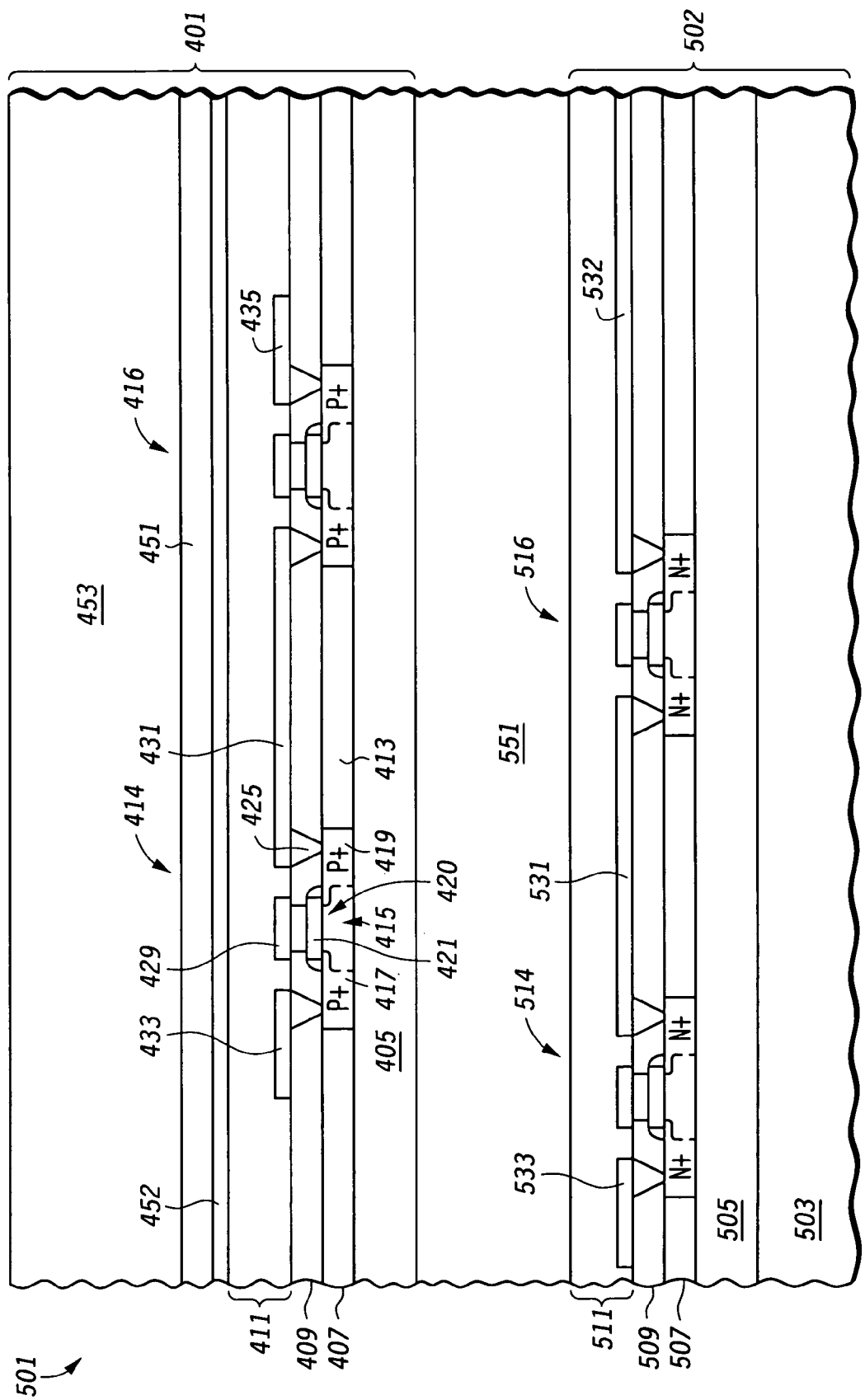
FIG. 5 is a partial cutaway side view of a wafer during another stage in manufacture of another embodiment of an integrated circuit according to the present invention
Figure 6:
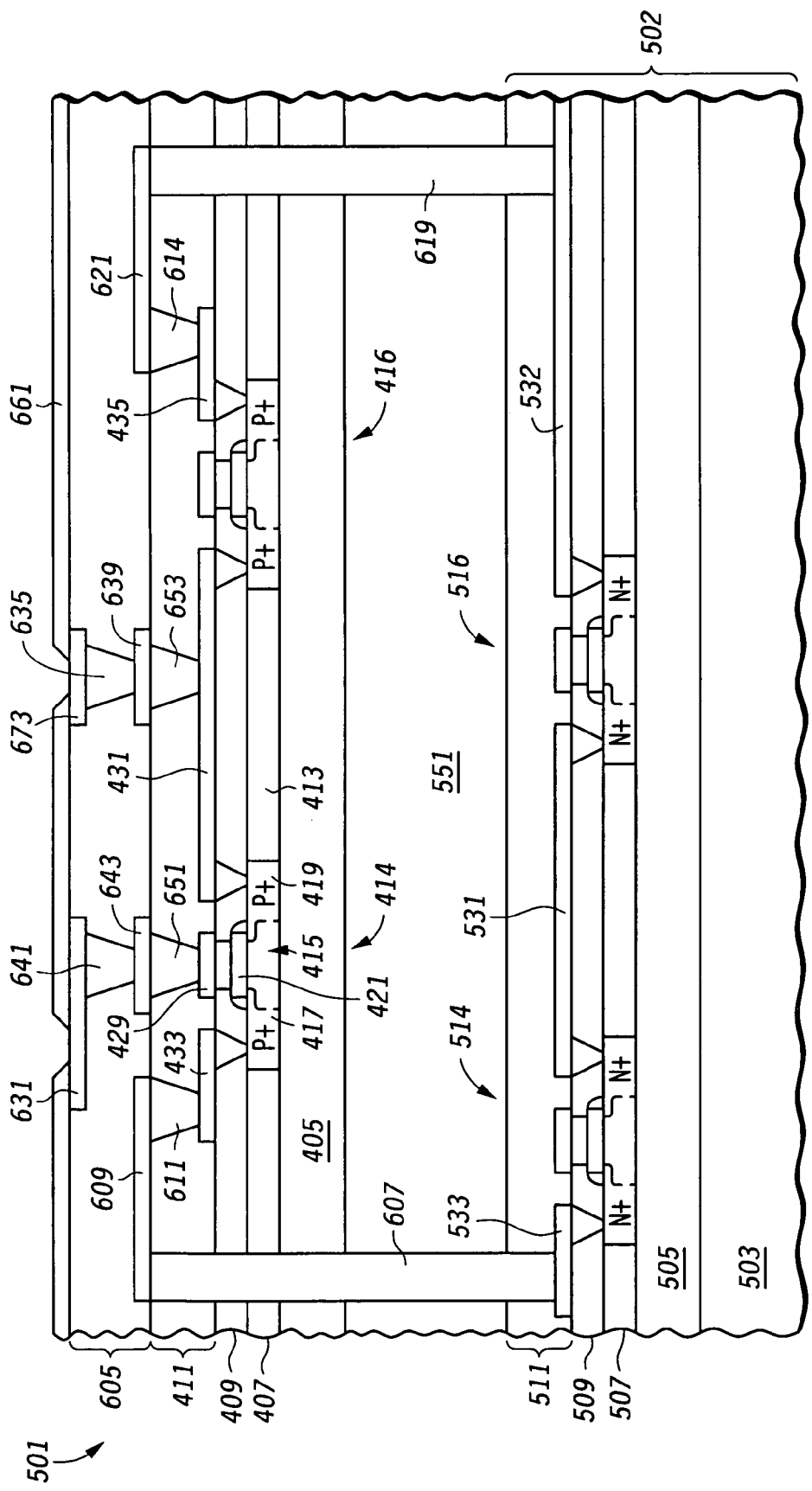
FIG. 6 is a partial cutaway side view of a wafer during another stage in manufacture of another embodiment of an integrated circuit according to the present invention The use of the same reference symbols in different drawings indicates identical items unless otherwise noted. The Figures are not necessarily drawn to scale.

FIGS. 4–6 show three different stages during the manufacture of one embodiment of an integrated circuit having channel regions in different layers in a face up configuration. FIG. 4 shows a wafer having P-channel transistors that will be attached to another wafer in a face up configuration. Shown in FIG. 4 are two P-channel transistors 414 and 416 located over insulator 405 and substrate 403. Transistor 414 includes an active region 415 formed in layer 407. Active region 415 is doped with an N conductivity type dopant (e.g. phosphorous or arsenic) and includes a body 426 and two source/drain regions 417 and 419 that are counter doped to have a P+ type conductivity. Transistor 414 includes a gate 421 (e.g. polysilicon or metal) located over the channel region 420 of active region 415. Wafer 401 also includes an ILD 411 with interconnects 433, 429, 431, and 435.

In one embodiment, substrate 403, insulator 405, layer 407, layer 409 and ILD 411 are similar to substrate 103, insulator 105, layer 107, layer 109 and ILD 111 of wafer 101.

After ILD 411 is formed, an oxide layer 452 is formed on ILD 411. In one embodiment, oxide layer 452 is 20 nm thick and is utilized to protect ILD 411 in subsequent processing.

Substrate 453 (e.g. silicon) is bonded to layer 452 with bonding material 451. In one embodiment, bonding material 451 is BCB, but may include other types of bonding material in other embodiments.

After substrate 453 has been bonded to layer 452, substrate 403 is removed e.g. by grinding and a subsequent etch. Wafer 401 is then bonded to another wafer in a face up configuration.

FIG. 5 is a partial side cutaway view after wafer 401 has been bonded to wafer 502 to form resultant wafer 501 in a face up configuration. Wafer 502 includes substrate 503, insulator 505, layer 507, layer 509, and ILD 511. ILD 511 includes interconnects 533, 531, and 532. Wafer 502 includes two N channel transistors 514 and 516. In one embodiment, wafer 502 is similar to wafer 201.

Wafer 401 is bonded to wafer 502 with bonding material 551. In one embodiment, bonding material 551 is BCB, but may be of other types of bonding material including bonding material with a low Young's modulus in other embodiments.

After wafer 401 has been bonded to wafer 502, substrate 453, bonding material 451, and layer 452 are removed.

FIG. 6 is as partial side cutaway view of the resultant wafer 501 after substrate 453, bonding material 451 and layer 452 have been removed. After the removal of layer 452 and prior to the formation of ILD 605, holes for vias 607 and 619 are formed through to interconnects 533 and 532, respectively of ILD 511. Holes are also formed through to interconnects 433, 429, 431, and 435, respectively, of ILD 411 for vias 611, 651, 653, and 614, respectively. After a layer of via metal is deposited to fill the holes, the resultant wafer 501 is polished (e.g. chemical mechanical polishing) for planarization and removal of excess metal exterior to the holes. Afterwards ILD 605 is formed. ILD 605 includes interconnect 609 to couple interconnects 533 and 433 together and interconnect 621 to couple interconnect 435 and 532 together. Also, ILD 605 also includes pads 631 and 673 and vias 641 and 635 for external coupling of the transistors shown of resultant wafer 501. A passivation layer 661 is formed on ILD 605 and openings are made for exposing pads 631 and 673. In other embodiments, wafer 501 may include other types of external conductive structures.

As with wafer 301, wafer 501 includes two layers 407 and 507 having channel regions of different strains. Accordingly, the channel regions of layer 407 have a strain that is relatively more compressive and therefore more beneficial for increased hole mobility and the channel regions of layer 507 have a strain that is relatively more tensile and therefore is more beneficial for electron mobility.

In one embodiment, the transistors shown in FIGS. 3 and 6 are utilized in an integrated circuit such as an integrated circuit implementing transistors in a complementary MOS (CMOS) configuration. In one embodiment, layers 107, 207, 407, and 507 traverse the entire surface of their respective wafers. In other embodiments, these layers are localized to specific areas of the wafer to implement specific circuits (e.g. a processor core, memory, or timer) of an integrated circuit.

In one embodiment, an integrated circuit includes a substrate, a first layer located over the substrate, and a first plurality of channel regions implemented in the first layer. At least a substantial majority of the channel regions implemented in the first layer are for transistors of a first conductivity type. The integrated circuit also includes a bonding material over the first layer, a second layer over the bonding material, and a second plurality of channel regions implemented in the second layer. At least a substantial majority of the channel regions implemented in the second layer are for transistors of a second conductivity type.

Another embodiment includes a method of forming an integrated circuit. The method includes providing a first wafer including a first layer. At least a substantial majority of the transistors having channel regions in the first layer are of a first conductivity type. The method also includes bonding a second wafer to the first wafer. The second wafer includes a second layer. At least a substantial majority of the transistors having channel regions in the second layer are of a second conductivity type. The method further includes removing a portion of the second wafer subsequent the bonding.

Another embodiment also includes a method of forming a integrated circuit. The method includes providing a first wafer comprising a first layer, a first insulator, and a first substrate. The first insulator is located between the first layer and the first substrate. The method also includes forming source/drain regions in the first layer. At least a substantial majority of the source/drain regions are of a first conductivity type. The method further includes providing a second wafer comprising a second layer, a second insulator, and a second substrate. The second insulator located between the second layer and the second substrate. The method still further includes forming source/drain regions in the second layer. At least a substantial majority of the source/drain regions are of a second conductivity type. The method also includes bonding the first wafer to the second wafer subsequent to the forming the source/drain regions in the first layer and the forming the source/drain regions in the second layer. The bonding includes bonding with a material having a low Young's modulus. The method includes removing the second substrate subsequent to bonding the first wafer to the second wafer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming an integrated circuit, the method comprising:
   providing a first wafer including a first layer, at least a substantial majority of a plurality of transistors having channel regions in the first layer are of a first conductivity type;
   bonding a second wafer to the first wafer, the second wafer including a second layer, at least a substantial majority of the plurality of transistors having channel regions in the second layer are of a second conductivity type; and
   removing a portion of the second wafer subsequent the bonding, wherein subsequent to the removing, the channel regions in the first layer generally have a first strain and the channel region in the second layer generally have a second strain, wherein the first strain is more tensile than the second strain.

2. The method of claim 1 wherein the removing includes removing at least 99 percent of the thickness of the second wafer.

3. The method of claim 1 further comprising:
   forming the second layer over a first substrate prior to the bonding a second wafer;
   bonding a second substrate over the second layer prior to the bonding the second wafer,
   removing the first substrate from the second layer prior to the bonding the second wafer;
   wherein the removing a portion of the second wafer includes removing the second substrate.

4. The method of claim 1 further comprising:
   forming an interlevel dielectric over the first and second wafers subsequent to the removing.

5. The method of claim 1 wherein the bonding includes bonding the second wafer such that the transistors having channel regions in the second layer are located face up with respect to the first wafer.

6. The method of claim 1 wherein the bonding includes bonding the second wafer such that the transistors having channel regions in the second layer are located face down with respect to the first wafer.

7. The method of claim 1 wherein the bonding includes bonding the second wafer with a bonding material having a Young's Modulus of about 10 giga pascals or less.

8. The method claim 1 wherein the bonding includes bonding the second wafer with a bonding material having a Young's Modulus of about 3 giga pascals or less.

9. The method of claim 1 further comprising:
   forming an interlevel dielectric over the transistors having channel regions in the second layer prior to the bonding, wherein the interlevel dielectric remains subsequent to the removing.

10. The method of claim 1 wherein the first conductivity is N-type and the second conductivity is P-type.

11. The method of claim 1 wherein:
   the first wafer includes an insulator, the first layer is located over the insulator;
   the second wafer includes a second insulator, the second layer located over the second insulator prior to the bonding.

12. The method of claim 11 wherein the removing includes removing the second insulator.

13. The method of claim 1 further comprising:
   forming a first interlevel dielectric over the first layer prior to the bonding;
   forming a second interlevel dielectric over the second layer prior to the bonding;
   forming a hole through at least a portion of the first interlevel dielectric and through at least a portion of the second interlevel dielectric subsequent to the removing; and
   filling the hole with conductive material.

14. A method of forming an integrated circuit, the method comprising:
   providing a first wafer comprising a first layer, a first insulator, and a fast substrate, the first insulator located between the first layer and the first substrate;
   forming source/drain regions in the first layer, wherein at least a substantial majority of the source/drain regions are of a first conductivity type;
   providing a second wafer comprising a second layer, a second insulator, and a second substrate, the second insulator located between the second layer and the second substrate;
   forming source/drain regions in the second layer, wherein at least a substantial majority of the source/drain regions are of a second conductivity type;
   bonding the first wafer to the second wafer subsequent to the forming the source/drain regions in the first layer and the forming the source/drain regions in the second layer; and
   removing the second substrate subsequent to bonding the first wafer to the second wafer, wherein subsequent to the removing, the first layer generally has a first strain and the second layer generally has a second strain, wherein the first strain is more tensile than the second strain.

15. The method of claim 5, wherein:
   the first conductivity type is N-type; and
   the second conductivity type is P-type.

16. The method claim 14 wherein the bonding includes bonding the second wafer in a face up configuration with respect to the first wafer.

17. The method claim 3 wherein the bonding includes bonding the second wafer in a face down configuration with respect to the first wafer.

18. The method of claim 3 further comprising;
   forming an interlevel dielectric over the second layer subsequent to the removing, the interlevel dielectric including a plurality of interconnects, with each interconnect of the plurality electrically coupled to a source/drain region of the first layer and a source/drain region of the second layer.

19. The method of claim 14 wherein the bonding includes bonding the second wafer with a bonding material having a Young's Modulus of about 10 giga pascals or less.

20. The method of claim 14 wherein the bonding includes bonding the second wafer with a bonding material having a Young's Modulus of about 3 giga pascals or less.

21. The method of claim 14 wherein the bonding includes bonding the second wafer with a bonding material, wherein the bonding material nuclides benzocyclobutene (BCB).

* * * * *

UNITED STATES PATENT AND TRADEMARK OFFICE
CERTIFICATE OF CORRECTION

PATENT NO. : 7,041,576 B2 Page 1 of 1
APPLICATION NO. : 10/856581
DATED : May 9, 2006
INVENTOR(S) : Scott K. Pozder It is certified that error appears in the above-identified patent and that said Letters Patent is hereby corrected as shown below:

In Column 6, Line 60, Claim No. 3:

Change "," to --;--

In Column 7, Line 43, Claim No. 14:

Change "fast" to --first--

Signed and Sealed this

Twentieth Day of March, 2007

JON W. DUDAS
*Director of the United States Patent and Trademark Office*